(12) United States Patent
Jakobs et al.

(10) Patent No.: US 7,224,636 B2
(45) Date of Patent: May 29, 2007

(54) SEMICONDUCTOR MEMORY MODULE

(75) Inventors: Andreas Jakobs, München (DE);
Hermann Ruckerbauer, Moos (DE);
Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/890,934

(22) Filed: Jul. 14, 2004

(65) Prior Publication Data
US 2005/0036349 A1    Feb. 17, 2005

(30) Foreign Application Priority Data
Jul. 17, 2003    (DE) ................... 103 32 616

(51) Int. Cl.
*G11C 8/00*    (2006.01)

(52) U.S. Cl. .................. 365/233; 365/233.5; 365/193

(58) Field of Classification Search ................ 365/233, 365/233.5, 193
See application file for complete search history.

(56) References Cited

U.S. PATENT DOCUMENTS 6,510,503 B2 *    1/2003    Gillingham et al. ........ 711/167

* cited by examiner

*Primary Examiner*—Viet Q. Nguyen
(74) *Attorney, Agent, or Firm*—Dicke, Billig & Czaja

(57) ABSTRACT

The invention relates to a semiconductor memory module having a plurality of memory chips arranged next to one another in a row. The memory module has a module-internal clock, command/address and data bus which transfers clock signal, command and address signals and also data signals from a memory controller device to the memory chips and data signals from the memory chips to the memory controller device. The memory module has respective clock, command/address and data signal lines. The clock signal lines comprise two differential clock signal lines which, at their end opposite to the memory controller device are either open or connected to one another by a short-circuiting bridge. The memory chips, during a write operation, synchronize the write data with the clock signal running from the memory controller device to the end of the clock signal line and, during a read operation, output the read data synchronously with the clock signal reflected from the open or short-circuited end of the clock signal lines.

10 Claims, 2 Drawing Sheets

- Termination
— DQ
- - - C/A
-·-·- CLK / STROBE

SEMICONDUCTOR MEMORY MODULE

CROSS-REFERENCE TO RELATED APPLICATIONS

This Utility Patent Application claims priority to German Patent Application No. DE 103 32 616.2, filed on Jul. 17, 2003, which is incorporated herein by reference.

BACKGROUND

The invention relates to a semiconductor memory module having a plurality of memory chips arranged next to one another in a row. The memory module has a module-internal clock, command/address and data bus which transfers clock signal, command and address signals and also data signals from a memory controller device to the memory chips and data signals from the memory chips to the memory controller device. The memory module has respective clock, command/address and data signal lines.

In semiconductor memory modules equipped with a plurality of very fast memory chips, for example DDR-DRAMs, arranged next to one another, there is a difficulty in precisely synchronizing the write and read data with a clock signal, said write and read data being transferred in two directions on the data bus lines between the memory chips and a memory controller device.

Therefore, in the case of previously realized semiconductor memory modules equipped with very fast memory chips, for example the latest generation of DDR-DRAMs, individual clock signal lines are routed with a precisely adjusted electrical length from the memory controller device to the individual memory chips. Another solution consists in routing two clock signal line runs on the semiconductor memory module across the memory chips arranged one after the other, the clock signals propagating in opposite directions on the two clock lines. In the case of the first solution variant therein realized in the prior art, the routing of the individual clock lines with a precisely adjusted electrical length is complicated and expensive, whereas the individual memory chips in the case of the second solution variant known in the prior art have to have separate write and read clock signal inputs.

SUMMARY

One embodiment of the present invention is a semiconductor memory module of the generic type that enables a clock signal topology that solves the above difficulties and also makes it easier to extend the number of memory chips with which the semiconductor memory module is equipped.

One embodiment of the invention uses the principle that an in-antiphase clock signal or strobe signal that propagates on two differential clock or strobe signal lines in one direction is reflected at the short-circuited or unterminated open ends of the differential clock signal or strobe signal lines and returns to its origin. Thus, one embodiment of the invention is a semiconductor memory module of the generic type that is defined by the fact that the clock signal lines comprise two differential clock signal lines which, at their end opposite to the memory controller device, are either open or connected to one another by a short-circuiting bridge. The memory chips, during a write operation, synchronize the write data with the clock signal running from the memory controller device to the end of the clock signal line and, during a read operation, output the read data synchronously with the clock signal reflected from the open or short-circuited end of the clock signal lines.

Consequently, according to one embodiment of the invention, the write data run in one direction together with the clock or strobe signal outgoing from the memory controller device. Said signal is reflected at the short-circuited or open ends of the differential clock or strobe signal lines and returns with the read data to the memory controller device.

In this case, one embodiment has a short-circuiting bridge at the end of the clock or strobe signal lines, such that the polarity of the reflected clock or strobe signal is reversed relative to the signal running to the short-circuited end of the clock or strobe signal line. Thus, the signal propagation direction can easily be distinguished and, by way of example, the rising edge of the clock or strobe signal can be used for synchronization of the write data and the falling edge of said signal can be used for synchronization of the read data.

In one exemplary embodiment of the semiconductor memory module according to the invention, by way of example, four, eight or sixteen DRAM memory chips are arranged in a row one behind the other, and the memory controller device is embodied by a buffer chip arranged on the semiconductor memory module.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
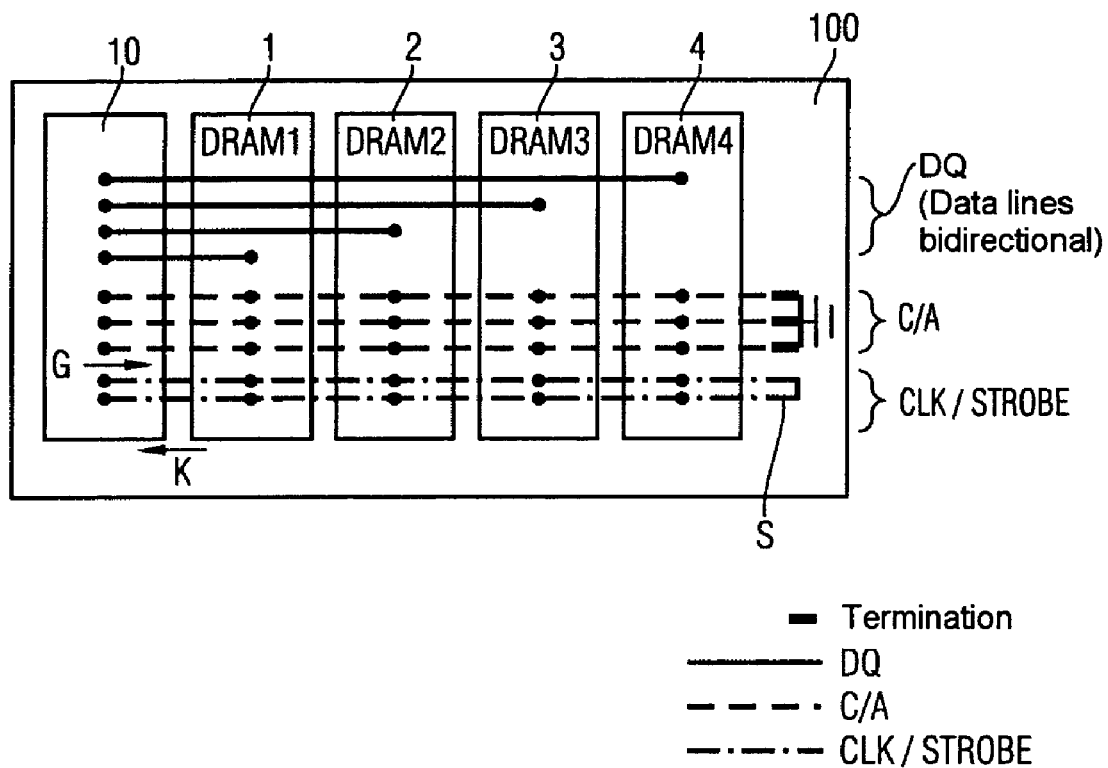
FIG. 1 illustrates a schematic layout view of a first exemplary embodiment of a semiconductor memory module according to the invention.

In the first exemplary embodiment of a memory module 100 of the invention as illustrated schematically in FIG. 1, for simplification four DRAM chips 1–4 are arranged one after the other at defined distances from a memory controller device 10. Instead of this, it is also possible to provide eight or sixteen memory chips on the memory module 100. A module-internal bus of the semiconductor memory module 100 has bidirectional data lines DQ in a point-to-point line routing (each solid line of the data lines DQ embodies for example eight bits of write and read data), command and address signal lines (fly-by-command and address bus) C/A which are illustrated in dashed lines and are terminated at their end remote from the memory controller device, and two differential clock or strobe signal lines CLK/STROBE, which are illustrated by dash/dotted lines and are short-circuited by a short-circuiting bridge S at their end remote from the memory controller device.

With this topology, on the semiconductor memory module according to this embodiment of the invention, it is possible to take up the data signals DQ and command and address signals from each nearest DRAM with a time delay of (for example) 200 ps. For optimum clock distribution and synchronization, it is necessary for the data and the clock signals, during writing and reading, in each case to run in the same direction and to have the same time offset. This is achieved by means of the differential clock lines CLK/STROBE that are short-circuited by a short-circuiting bridge S at their end.

Figure 2:
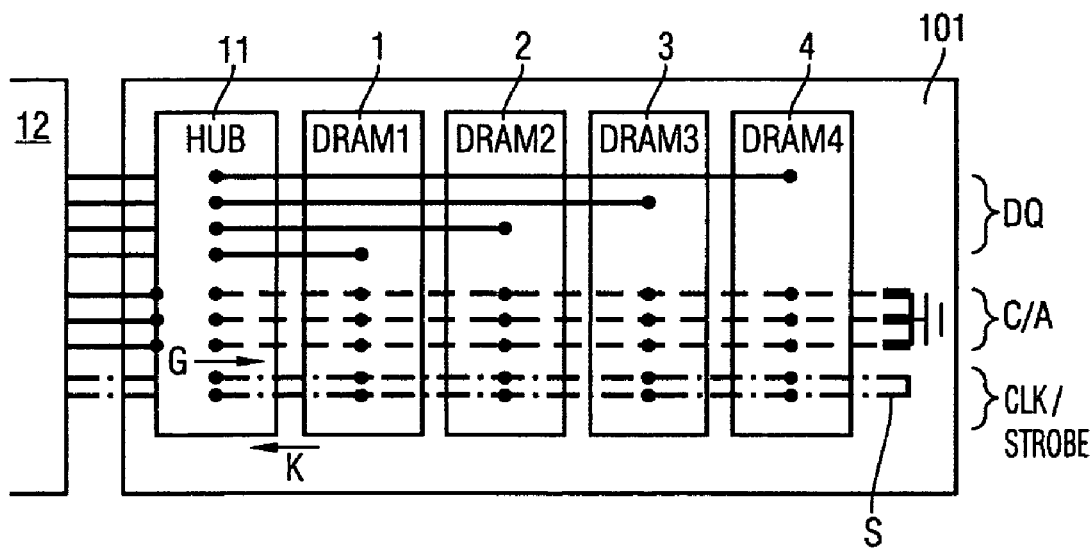
FIG. 2 illustrates a second exemplary embodiment according to the invention of a semiconductor memory module.

The second exemplary embodiment that is likewise illustrated schematically in FIG. 2 differs from that in FIG. 1 only in that the memory controller device is embodied by a buffer chip 11 (HUB chip), which is arranged on the semiconductor memory module 101 and has driver functions for the write data DQ, the command and address signals C/A and the clock or strobe signal CLK/STROBE. The superordinate memory controller functions are contained in an external memory controller chip 12 connected by an external bus system to the buffer chip 11 on the semiconductor memory module 101.

In the two exemplary embodiments illustrated in FIGS. 1 and 2, the differential clock or strobe signal lines CLK/STROBE are short-circuited by a short-circuiting bridge S at their end remote from the memory controller device 10 and 11, respectively, and thereby have the effect of changing the polarity of the clock or strobe signal at the short-circuited end. This makes it easier to distinguish the signal propagation direction, so that, by way of example, a rising edge of a strobe signal can be used for synchronization of the write data and a falling edge of the strobe signal can be used for synchronization of the read data during the read operation. The outgoing direction of the clock or strobe signal CLK/STROBE relative to the memory controller device 10 or 11, respectively, is indicated by an arrow designated by G, while the incoming direction of the clock or strobe signal is indicated by an arrow designated by K.

As already mentioned, a reflection also occurs at the open end of differential clock lines, although the polarity of the signal is not reversed during said reflection, so that the propagation direction of the clock or strobe signal cannot be distinguished in the simple manner mentioned above.

Figure 3:
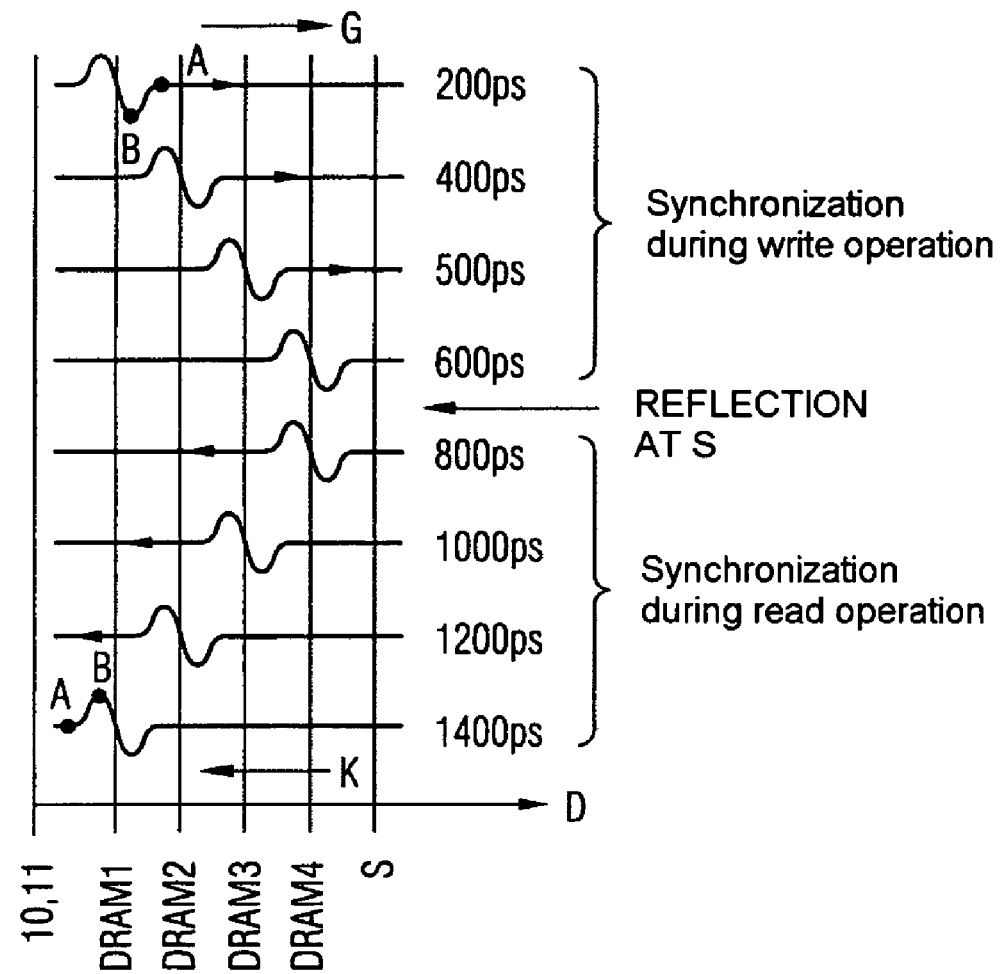
FIG. 3 illustrates a signal-distance diagram that schematically illustrates an in-antiphase strobe signal that runs to a short-circuited end of two differential clock or strobe signal lines and is reflected back there.

FIG. 3 illustrates a signal diagram of a clock or strobe pulse that illustrates the state of the outgoing signal component (arrow G) and of the reflected signal component (arrow K) at the distances D specifying four positions of the DRAM chips 1–4 on the semiconductor memory module. It shall be expressly mentioned here that D does not represent time. The memory controller device 10 or the buffer chip 11 is situated at the zero point of the abscissa and the short-circuiting bridge S is situated at that point on the abscissa which is designated by S, and the four DRAM chips 1–4 lie in between in each case spaced apart identically. The change in polarity is indicated by the points A and B at the topmost and bottommost signal component in FIG. 3. The outgoing (arrow G) clock or strobe signal is used, during the write operation, for synchronization of the data to be written in the memory chips, while the clock or strobe signal component that is reflected at the short-circuiting point S and is indicated by the arrow K is used for synchronization of the read data during read operations. 200 ps are in each case assumed as time delay (temporal spacing) between each memory chip. This time delay depends, of course, on the signal propagation time and thus on the distance D.

Figure 4:
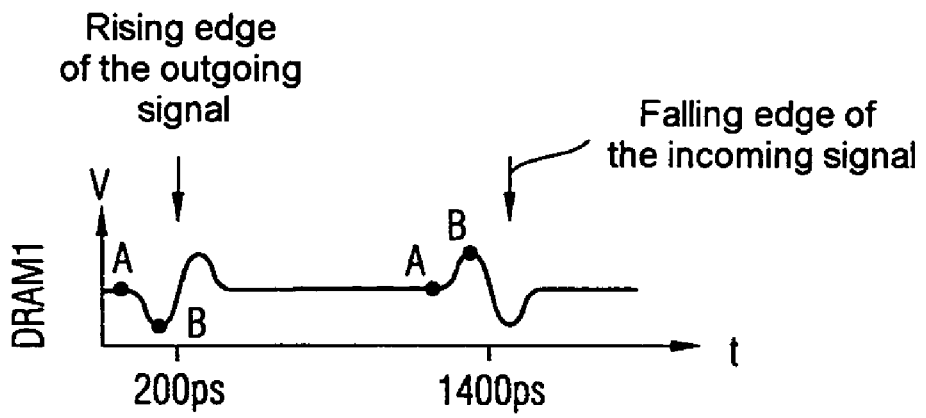
FIG. 4 illustrates a schematic signal timing diagram of the in-antiphase strobe signal that is reflected at the short-circuited end of the differential clock or strobe signal lines and whose pulse outgoing from the memory controller device arrives at a first DRAM1 at a first instant and whose reflected pulse arrives at the same DRAM1 at a second, later instant determined by the distance from the DRAM.

FIG. 4 illustrates a signal timing diagram of the outgoing signal, which arrives at the first DRAM chip 1 200 ps after it has been output, and whose rising edge is used for synchronization of the write data. The rising edge here is the edge between the signal minimum and the signal maximum. Furthermore 1400 ps later the reflected signal component of the clock or strobe signal is shown at the same DRAM chip 1, the falling edge thereof being used for synchronization of the read data. The polarity reversal as a result of the reflection at the short-circuited end is once again illustrated by points A and B on the signal components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory module comprising:
a plurality of memory chips arranged next to one another in an row;
a memory controller device; and
a module-internal clock, command/address and data bus that transfers a clock signal, command and address signals and also data signals from the memory controller device to the memory chips and data signals from the memory chips to die memory controller device and that has respective clock, command/address and data signal lines;
wherein the clock signal lines further comprise two differential clock signal lines each having first and second ends, the first ends of which are coupled to the memory controller device and the second ends configured such that a clock signal propagated on the two differential clock signals lines from their first ends in one direction is reflected at their second ends and returns the opposite direction to the first ends of the two differential clock signal lines, and wherein the memory chips synchronize write data with the clock signal running from the memory controller device to the second ends of the clock signal line during a write operation and wherein the memory chips output read data synchronously with the clock signal reflected back from the second ends of the clock signal lines.

2. The semiconductor memory module of claim 1, wherein the two differential clock signal lines together transfer a differential clock signal having continuously alternating opposite phases.

3. The semiconductor memory module of claim 1, wherein the clock signal lines together transfer differential write and read data strobe signal in opposite phases.

4. The semiconductor memory module of claim 1, wherein the second ends of the two differential clock signal lines are short-circuited together by a short-circuiting bridge.

5. The semiconductor memory module of claim 4, wherein the memory chips axe configured such that they synchronize the data tat are to be written during a write operation with a rising edge of the clock signal and the data that are to be read during a read operation with a falling edge of the clock signal.

6. The semiconductor memory module of claim 5, wherein the memory controller device is configured such that it outputs the data that are to be written during a write operation with a rising edge of the clock signal driven by it and accepts the data received during a read operation with a falling edge of the clock signal.

7. A semiconductor memory module comprising:
a plurality of memory chips arranged next to one another in an row;
a memory controller device; and
a module-internal clock, command/address and data bus that transfers a clock signal, command and address signals and also data signals from the memory controller device to the memory chips and data signals from the memory chips to the memory controller device and that has respective clock, command/address and data signal lines;
wherein the clock signal lines further comprise two differential clock signal lines each having first and second ends, the first ends of which are coupled to the memory controller device and the second ends configured such that a clock signal propagated on the two differential clock signals lines in one direction is reflected and returns to its origin, and wherein the memory chips synchronize write data with the clock signal running from the memory controller device to the second ends of the clock signal line during a write operation and wherein the memory chips output read data synchronously with the clock signal reflected back from the second ends of the clock signal lines;
wherein the memory controller device is embodied by a buffer chip arranged on the semiconductor memory module.

8. The semiconductor memory module of claim 1, wherein the memory chips are in each case located at a predetermined identical distance from one another, and a first memory chip in the row is located at the same predetermined distance from the memory controller device on the semiconductor memory module.

9. The semiconductor memory module of claim 1, wherein the second ends of the two differential clock signal lines have open ends.

10. The semiconductor memory module of claim 1, wherein the memory controller device is embodied by a buffer chip arranged on the semiconductor memory module.

* * * * *